United States Patent
Datar et al.

(10) Patent No.: US 10,241,680 B2
(45) Date of Patent: Mar. 26, 2019

(54) METHODS FOR ESTIMATING COST SAVINGS USING DEDUPLICATION AND COMPRESSION IN A STORAGE SYSTEM

(71) Applicant: HEWLETT PACKARD ENTERPRISE DEVELOPMENT LP, Houston, TX (US)

(72) Inventors: Ashutosh Datar, San Jose, CA (US); Rajat Sharma, San Jose, CA (US); Sandeep Karmarkar, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 8 days.

(21) Appl. No.: 15/445,890

(22) Filed: Feb. 28, 2017

(65) Prior Publication Data
US 2018/0246649 A1    Aug. 30, 2018

(51) Int. Cl.
*G06F 12/10* (2016.01)
*G06F 3/06* (2006.01)

(52) U.S. Cl.
CPC ............ *G06F 3/0605* (2013.01); *G06F 3/067* (2013.01); *G06F 3/0608* (2013.01); *G06F 3/0641* (2013.01)

(58) Field of Classification Search
CPC ....... G06F 3/0605; G06F 3/067; G06F 3/0608
USPC ........................................................ 711/154
See application file for complete search history.

(56) References Cited

U.S. PATENT DOCUMENTS

| | | | |
|---|---|---|---|
| 2013/0254441 A1* | 9/2013 | Kipnis | H03M 7/30 710/68 |
| 2014/0119231 A1* | 5/2014 | Chan | H04L 47/34 370/253 |

OTHER PUBLICATIONS

Durand et al., "Loglog Counting of Large Cardinalities," 2003, ESA 2003, LNCS 2832, pp. 605-617, <http://www.ens-lyon.fr/LIP/Arenaire/SYMB/teams/algo/algo4.pdf>.
Heule et al., "HyperLogLog in Practice: Algorithmic Engineering of a State of the Art Cardinality Estimation Algorithm," EDBT/ICDT '13, Mar. 18-22, 2013, <https://stefanheule.com/papers/edbt13-hyperloglog.pdf>.
Wikipedia, "HyperLogLog," Jan. 7, 2017, <https://en.wikipedia.org/w/index.php?title=HyperLogLog&oldid=758719094>.

* cited by examiner

*Primary Examiner* — Jae U Yu

(57) ABSTRACT

Methods for estimating cost savings in a storage system using an external host system. One method includes accessing over a communication network data from a unit of storage of a data storage system, wherein each of the blocks of data is uncompressed. A plurality of blocks is parsed from the data. A plurality of fingerprints is generated from the blocks using a hash algorithm. A deduplication ratio is estimated for the plurality of blocks stored in the unit of storage using a hyperloglog algorithm and a first plurality of buckets compartmentalizing the plurality of blocks, wherein the first plurality of buckets is defined by precision bits of the plurality of fingerprints. An effective compression ratio is estimated for the plurality of blocks stored in the unit of storage using the hyperloglog algorithm and a second plurality of buckets compartmentalizing the plurality of blocks, wherein the second plurality of buckets is defined by ranges of compression ratios.

17 Claims, 8 Drawing Sheets

METHODS FOR ESTIMATING COST SAVINGS USING DEDUPLICATION AND COMPRESSION IN A STORAGE SYSTEM

TECHNICAL FIELD

The present embodiments relate to methods, systems, and programs for storing data, and more particularly, methods, systems, and computer programs for estimating cost savings in a networked data storage system.

BACKGROUND

Network storage, also referred to as network storage systems or data storage systems, is computer data storage connected to a computer network providing data access to heterogeneous clients. Typically, network storage systems process a large amount of Input/Output (IO) requests, and high availability, speed, and reliability are desirable characteristics of network storage. In addition to processing read and write IO requests, network storage systems perform deduplication and compression techniques to manage the storage space.

Data deduplication, or simply called deduplication includes processes to eliminate duplicate copies of repeating data. For example, data deduplication inspects volumes of data and identifies sections (e.g., entire files or large sections of files) that are identical, and stores only one copy of the repeated data in the storage space. With perfect data deduplication, only one instance is stored. However, data deduplication processes are not perfect, such that different deduplication processes achieve varying efficiencies of data deduplication.

Data compression includes processes to reduce the amount of data in the storage space. That is, the original data is stored using fewer bits than in its original form. In that manner, more data can be stored into the storage space. The data may be decompressed before transmission and/or use by the client. Data compression techniques can be computationally expensive, and result in various efficiencies of compression depending on the technique used by a data storage system.

Outside of the controller system that manages the network storage system, it is difficult to determine the efficacy of deduplication and compression. That is, a host system that is external to the network storage system cannot look into the internal management operations of the system, and as such may have a difficult time determining how well a network storage system is performing deduplication and compression. This information may be useful in determining performance of different network storage systems.

What is needed are efficient ways to determine cost savings of a network storage system from an external host system.

It is in this context that embodiments arise.

SUMMARY

The present embodiments relate to solving one or more problems found in the related art, and specifically to provide for fair utilization of system resources of a data storage system. In particular, methods and systems are presented for estimating the cost savings in a data storage system, including estimating the data deduplication and effective compression ratios of data stored in the data storage system. It should be appreciated that the present embodiments can be implemented in numerous ways, such as a method, an apparatus, a system, a device, or a computer program on a computer readable medium. Several embodiments are described below.

In one embodiment, a method for estimation is disclosed. The method includes accessing over a communication network data from a unit of storage of a data storage system, wherein each of the plurality of blocks of data is uncompressed. The method further includes parsing a plurality of blocks from the data. The method includes generating a plurality of fingerprints based on the plurality of blocks using a hash algorithm. The method includes estimating a deduplication ratio for the plurality of blocks stored in the unit of storage. The estimation is performed using a hyperloglog algorithm, and is performed on a first plurality of buckets which compartmentalize the plurality of blocks. The first plurality of buckets is defined by precision bits of the plurality of fingerprints. The method includes estimating an effective compression ratio for the plurality of blocks stored in the unit of storage. The estimation is performed using the hyperloglog algorithm, and is performed on a second plurality of buckets which compartmentalize the plurality of blocks. The second plurality of buckets is defined by ranges of compression ratios.

In another embodiment, another method for estimation is disclosed. The method includes accessing over a communication network data from a unit of storage of a data storage system, wherein each of the plurality of blocks of data is uncompressed. The method further includes parsing a plurality of blocks from the data. The method includes generating a plurality of fingerprints based on the plurality of blocks using a hash algorithm. The method includes estimating an effective compression ratio for the plurality of blocks stored in the unit of storage. The estimation is performed using the hyperloglog algorithm, and is performed on a plurality of buckets which compartmentalize the plurality of blocks. The plurality of buckets is defined by ranges of compression ratios.

In still another embodiment, a non-transitory computer-readable medium storing a computer program for estimation is disclosed. The computer-readable medium includes program instructions for accessing over a communication network data from a unit of storage of a data storage system, wherein each of the plurality of blocks of data is uncompressed. The computer-readable medium further includes program instructions for parsing a plurality of blocks from the data. The computer-readable medium further includes program instructions for generating a plurality of fingerprints based on the plurality of blocks using a hash algorithm. The computer-readable medium further includes program instructions for estimating a deduplication ratio for the plurality of blocks stored in the unit of storage. The estimation is performed using a hyperloglog algorithm, and is performed on a first plurality of buckets which compartmentalize the plurality of blocks. The first plurality of buckets is defined by precision bits of the plurality of fingerprints. The computer-readable medium further includes program instructions for estimating an effective compression ratio for the plurality of blocks stored in the unit of storage. The estimation is performed using the hyperloglog algorithm, and is performed on a second plurality of buckets which compartmentalize the plurality of blocks. The second plurality of buckets is defined by ranges of compression ratios.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods that provide for estimating the cost savings in a data storage system, including estimating the data deduplication and effective compression ratios of data stored in the data storage system.

With the above general understanding of the various embodiments, example details of the embodiments will now be described with reference to the various drawings. Similarly numbered elements and/or components in one or more figures are intended to generally have the same configuration and/or functionality. It will be apparent, that the present embodiments may be practiced without some or all of these specific details. In other instances, well-known process operations have not been described in detail in order not to unnecessarily obscure the present embodiments.

Figure 1:
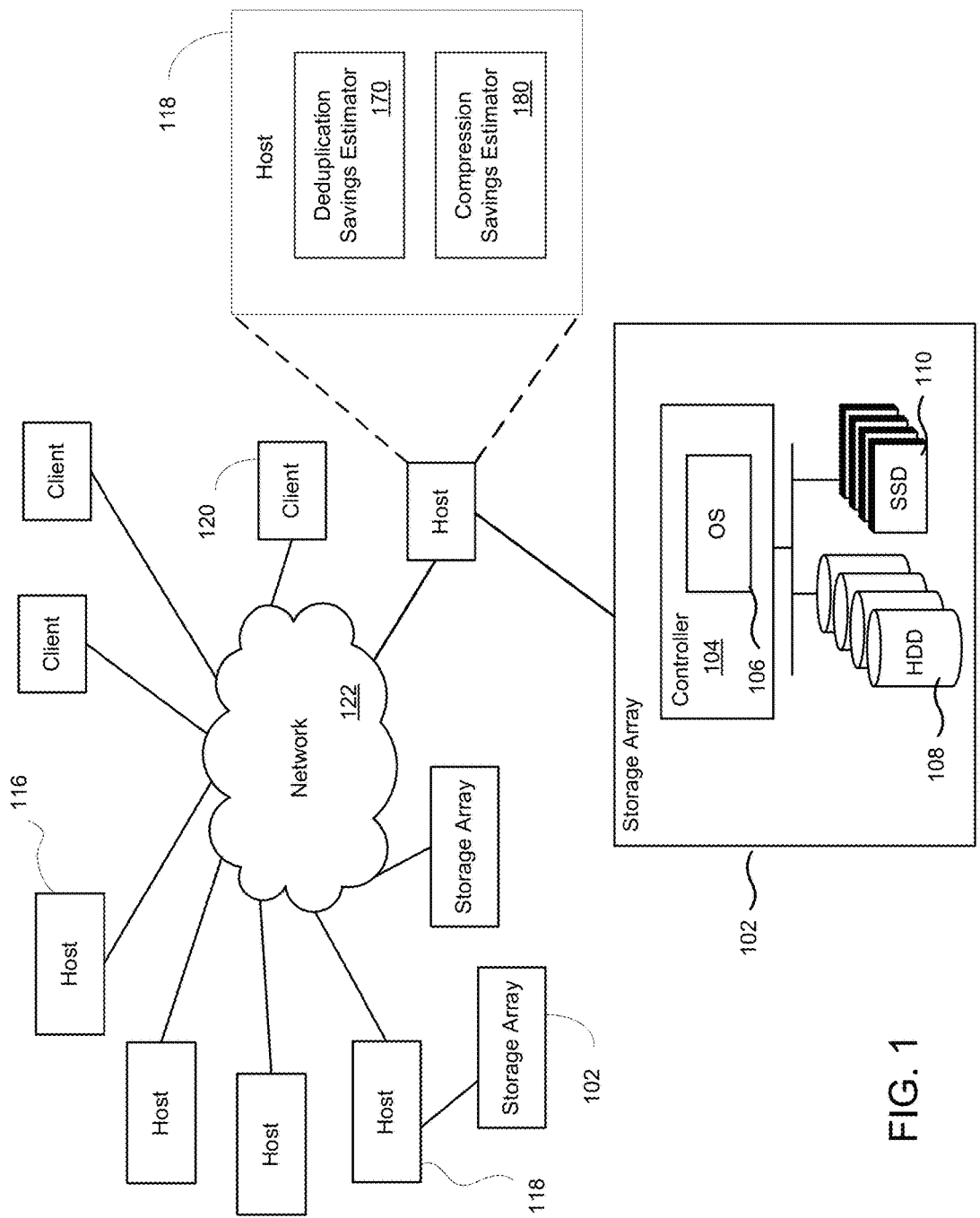
FIG. 1 depicts a system with network storage, in accordance with one embodiment of the present disclosure.

FIG. 1 depicts a system with network storage, according to one embodiment. The networked storage device, also referred to herein as a storage array 102 or a data storage system, includes a controller 104 with a storage operating system 106, which is a multitasking system able to execute several tasks concurrently. One or more tasks are configured to process IO requests, and these tasks that process IOs are referred to herein as foreground tasks. Background tasks are tasks that do not cause a host initiator to wait for their output. For example, background tasks may include system maintenance tasks (e.g., processing an alert when resource consumption reaches a threshold, taking a scheduled snapshot, garbage collection (GC), etc.). For example, the operating system 106 is configured to perform deduplication and compression when storing data into the storage array 102.

In the example architecture of FIG. 1, one or more storage arrays 102 provide storage services to one or more servers 116, 118 (which are referred to herein as hosts) and to one or more clients 120. The configuration will depend on the implementation of the storage array and the demand by application. Network 122 provides transport for the data exchanges between the storage array 102 and servers 116, 118 or clients 120. In addition, server 118 may be directly connected to a storage array without communicating through network 122. Storage array 102 includes one or more memory controllers 104, one or more hard disk drives (HDD) 108, and one or more solid state drives (SSD) 110, also referred to herein as flash cache. Additional examples regarding the system are provided below.

In one embodiment, a tool is implemented to estimate approximate space savings for compression, deduplication, and zero-blocks in storage array 102. The tool is implemented as a host-side tool that runs on a physical host, or can be implemented on a virtual machine acting as a host, wherein the virtual machine is configured as a host to reduce dedicated use of the physical host. As shown in FIG. 1, the host 116 or 118 includes a deduplication savings estimator 170 and a compression savings estimator 180. The deduplication savings estimator 170 estimates an effective deduplication ratio for data stored in the storage array 102. The compression savings estimator 180 estimates the effective post-deduplication compression ratio for the data stored in the storage array 102.

These deduplication and compression estimates give an understanding of how well the storage array 102 is operating. For example, the size reduction on a storage volume can be given after enabling deduplication and/or compression on the storage array 102. In addition, these deduplication and compression estimates can provide a way to verify data reduction guarantees provided by the storage array 102 vendor. That is, the deduplication savings estimator 170 and a compression savings estimator 180 can give savings estimations for any storage vendor, and operate on data indiscriminate of storage operations.

Figure 2:
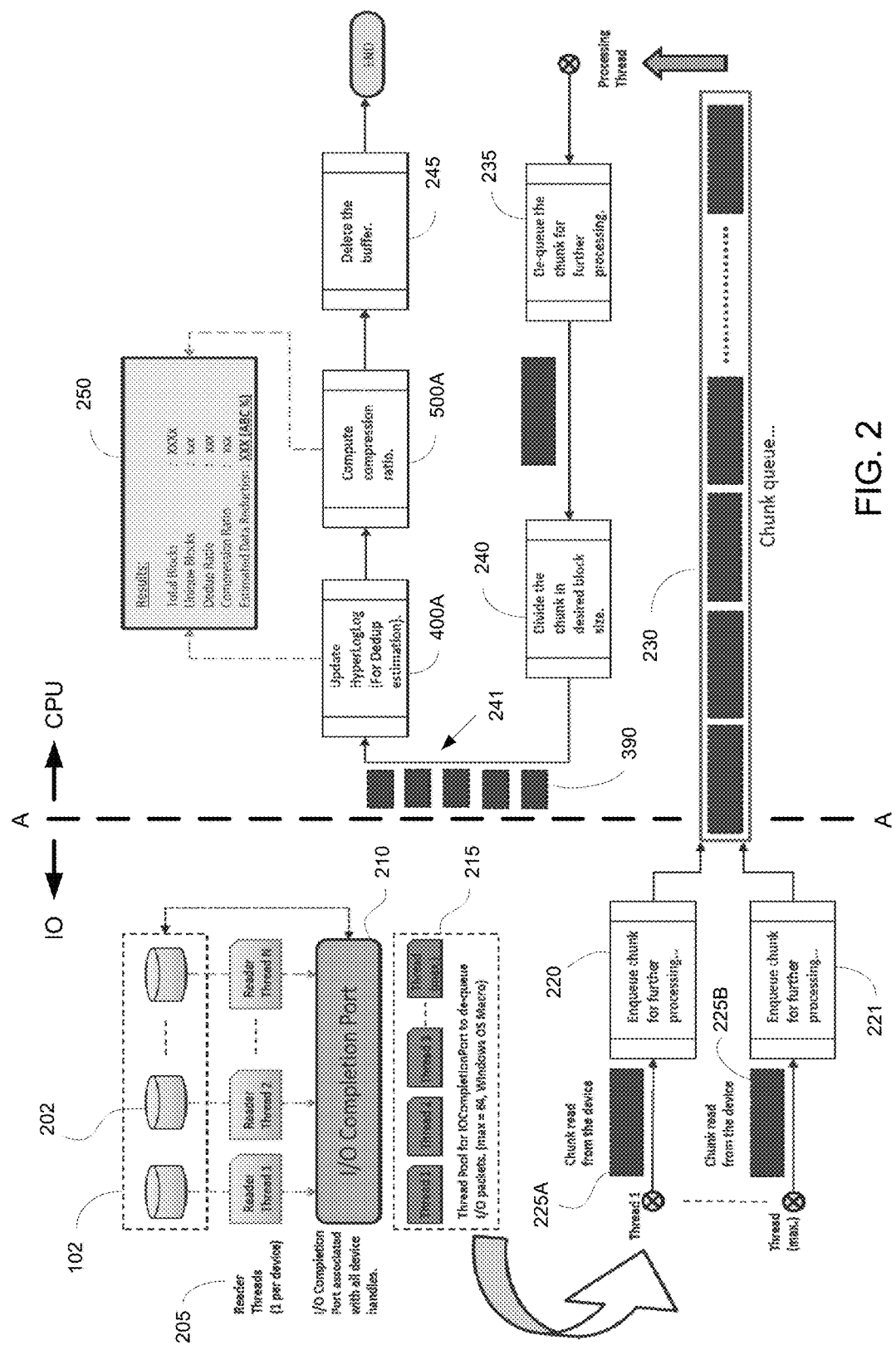
FIG. 2 is a data flow diagram illustrating the data flow when performing methods for determining cost savings on a storage array, in accordance with one embodiment of the present disclosure.

FIG. 2 is a data flow diagram 200 illustrating the flow of data when performing methods for determining cost savings on a storage array, in accordance with one embodiment of the present disclosure. As previously described, the tool implementing the methods for determining cost savings on the storage array is executed on the host computer (e.g., 116, 118). As shown in FIG. 2, the tool may be considered in two parts, wherein the first part representing the IO centric part of the data flow for accessing and receiving the data at the host is located to the left side of line A-A, and the second part representing the flow of data through the CPU of the host is located to the right side of line A-A.

As shown, data is accessed by the host 116, 118 from storage array 102 by scanning through one or more storage endpoints. Data is read from the disks of storage array 102, and no write operations are performed. As such, the performance of the cost savings estimators (deduplication and compression) depends on the IO channel bandwidth. Also, because no write operations are performed, there is no risk of data corruption in storage array 102. In one implementation, the estimations for cost savings are performed on the backup copy of data to reduce downtime on storage array 102. In another embodiment, the estimations for cost savings are performed on a static copy of data (e.g., read-only snapshot) for an accurate estimate.

In particular, data is read from the storage array 102 through reader threads 205 (e.g., 1 to N). In one implementation, there is one reader thread 205 per storage device (e.g., physical disk 202) in the storage array 102, wherein the reader threads 205 operate in parallel to access the data from storage array 102. For example, the reader threads 205 generate and/or handle overlapped IO requests from the host 116, 118.

In particular, one or more IO completion ports 210 at the host 116, 118 are configured to handle the parallel IO generated by the reader threads 205. The IO completion ports 210 are configured for performing multiple simultaneous asynchronous IO operations. When IO services are requested on a data object, the corresponding IO completion port 210 indicates completion of data delivery (e.g., through a message). In that manner, the IO completion ports 210 are able to manage multiple threads 205 and their concurrencies.

The IO completion port configures a thread pool 215 (e.g., thread 1 to thread maximum) to dequeue the IO packets (e.g., data read from the storage array 102). In one implementation, the maximum number of threads in the thread pool 215 is 64. Per each thread, data is read in chunks at a time. The chunk size is configurable to control the maximum throughput, and in one implementation, the chunk size is 800 KB. As such, a corresponding IO port 210 manages 64 dequeue threads in the thread pool 215, and wakes up a thread from the pool whenever there is a completed IO packet available.

Upon dequeuing a packet (e.g., chunk of 800 KB), the corresponding thread in thread pool 215 enqueues the chunk for further processing. For example as shown, thread 1 enqueues a chunk 225A read from a corresponding device (as shown in operation 220) for further processing, and thread max enqueues (as shown by operation 221) a chunk 225B read from a corresponding device for further processing. As such, the chunks are configured into a chunk queue 230.

In operation 235, the chunks are dequeued from queue 230. This operation acts as a bridge between the IO and CPU centric parts, previously described. In operation 240, each of the chunks are divided into a desired block size, wherein the block size is configurable (e.g., 512 bytes, 1 KB, 2 KB, 4 KB, 8 KB, 16 KB, 32 KB, 64 KB, 128 KB, etc.). In one embodiment, the blocks are all of the same size. As shown, queue 241 includes a plurality of blocks.

Flow diagrams 400A and 400B combined perform the methods for estimating the cost savings in a data storage system (e.g., storage array 102), and outlines the required processing performed on the blocks in queue 241, according to a sampling ratio. For example, in one implementation, all the blocks from queue 241 are sampled. In another implementation, every Nth block is sampled, depending on the sampling ratio. In particular, flow diagram 400A estimates the cost savings due to data deduplication, and flow diagram 500A estimates the cost savings due to compression. After processing, the buffer is deleted in operation 245.

The numbers from different processing are updated in a single state object to give final results 250. For example, the state object may be the one or more disks in the storage array 102. The state object may be defined as a unit of storage, such as one or more volumes, one or more logical unit numbers (LUNs), etc. The results from the flow diagrams 400A and 500A my include the following data: total data size, block size, sampled data size, total number of blocks sampled, number of zero-data blocks, estimated deduplication ratio, estimated compression ratio, and estimated space savings.

Figure 3:
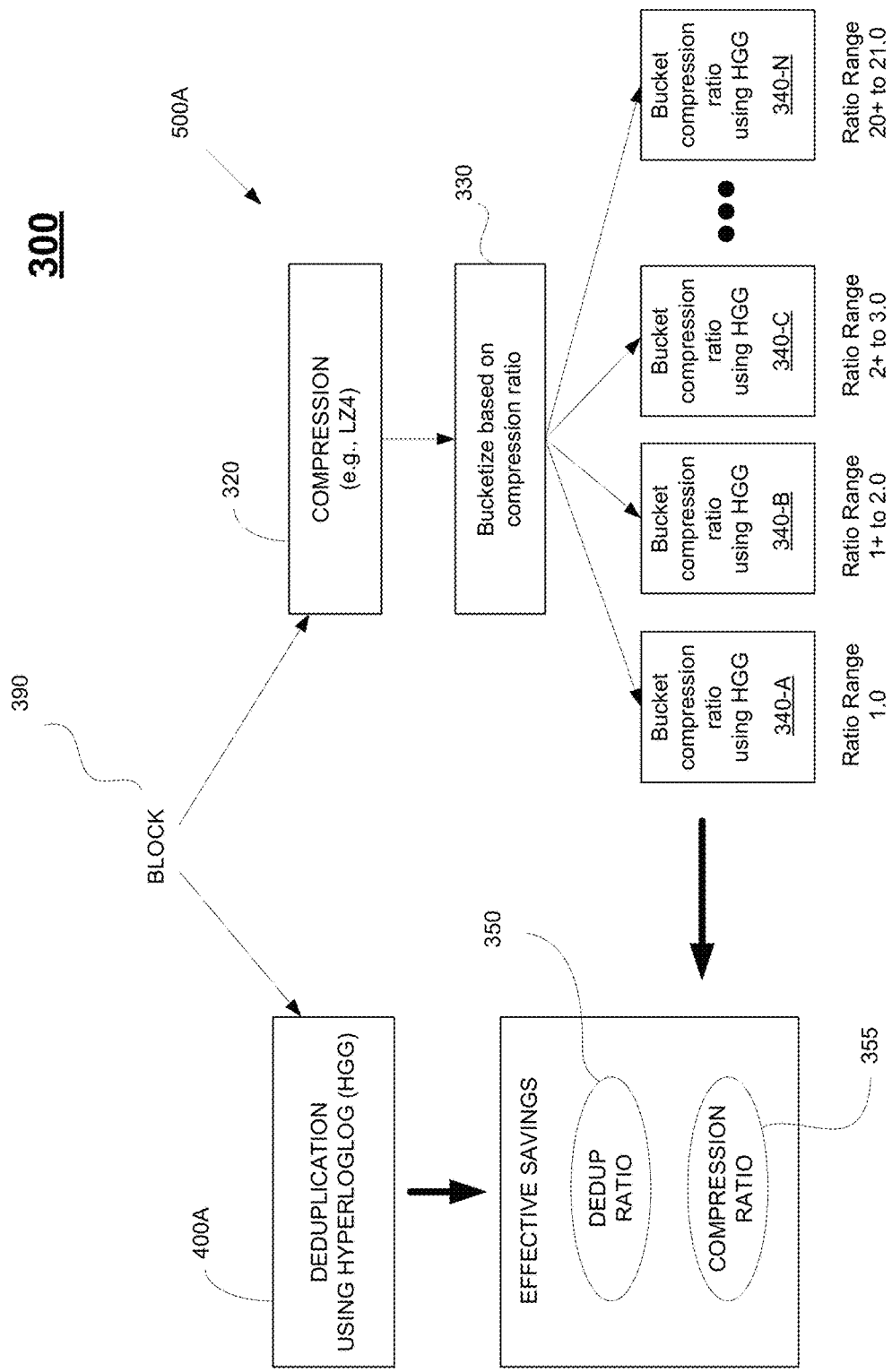
FIG. 3 is a flow diagram illustrating the estimation of cost savings in the form of a deduplication ratio and a compression ratio on a storage array, in accordance with one embodiment of the present disclosure.

FIG. 3 is a flow diagram 300 illustrating the estimation of cost savings in the form of a deduplication ratio and a compression ratio on a storage array, in accordance with one embodiment of the present disclosure. In particular, flow diagram 300 focuses on the operations in flow diagram 200 when determining cost savings for deduplication (e.g., flow diagram 400A) and compression (e.g., flow diagram 500A) in a storage array 102. That is, flow diagram 300 is performed on each of the blocks in queue 241. Thereafter, numbers are consolidated in the deduplication processes performed in flow diagram 400A and the compression processes performed in flow diagram 400A to compute final results (e.g., deduplication ratio 350 and compression ratio 355).

Figure 4A:
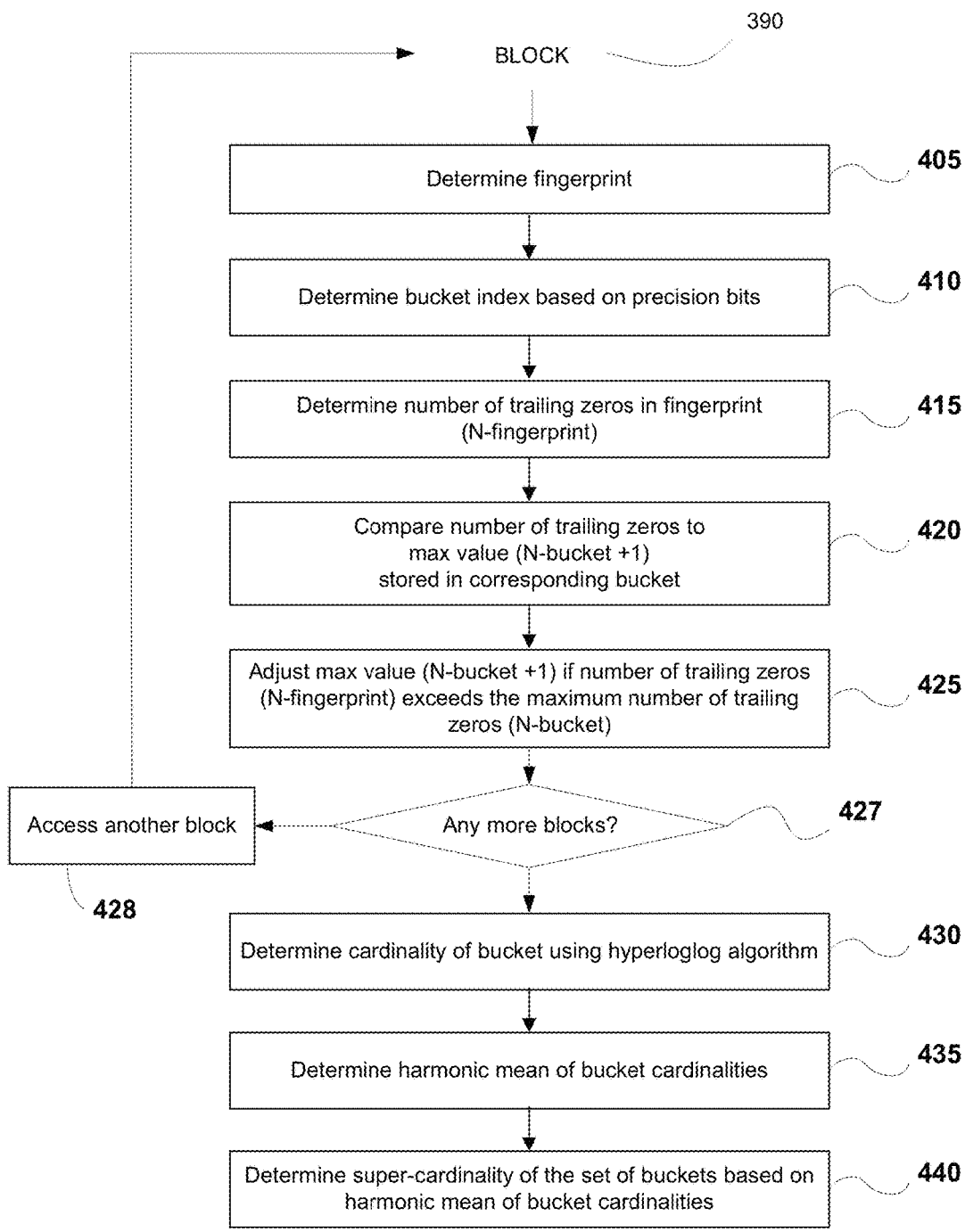
FIG. 4A is a flow diagram illustrating a method for determining cost savings on a storage array including the estimation of a deduplication ratio, in accordance with one embodiment of the present disclosure.

As shown, for block 390, operations are performed as outlined by flow diagram 400A, which is more fully described in FIG. 4A. In particular, flow diagram 400A is performed to determine deduplication cost savings. In that manner, the effective cost savings from deduplication performed at storage array 102 is estimated as an overall or effective deduplication ratio 350. Generally, the process performed by flow diagram 400 includes creating a hash (fingerprint of each number/element/block in a dataset (e.g., bucket, unit of storage, volume, LUN, etc.). The number of trailing zeros is observed in the hashes, and a maximum number is observed. The cardinality may be estimated generally by noting that if a maximum 'N' number of trailing zeros is observed, then there are approximately $2\hat{}['N+1']$ (e.g., $2^{N+1}$) unique elements. By understanding the number of unique elements (e.g., blocks) in a dataset, then the deduplication ratio for the dataset can be estimated by dividing the "total block count" by the "cardinality of the set," wherein cardinality is determined based on a hyperloglog algorithm.

Figure 5A:
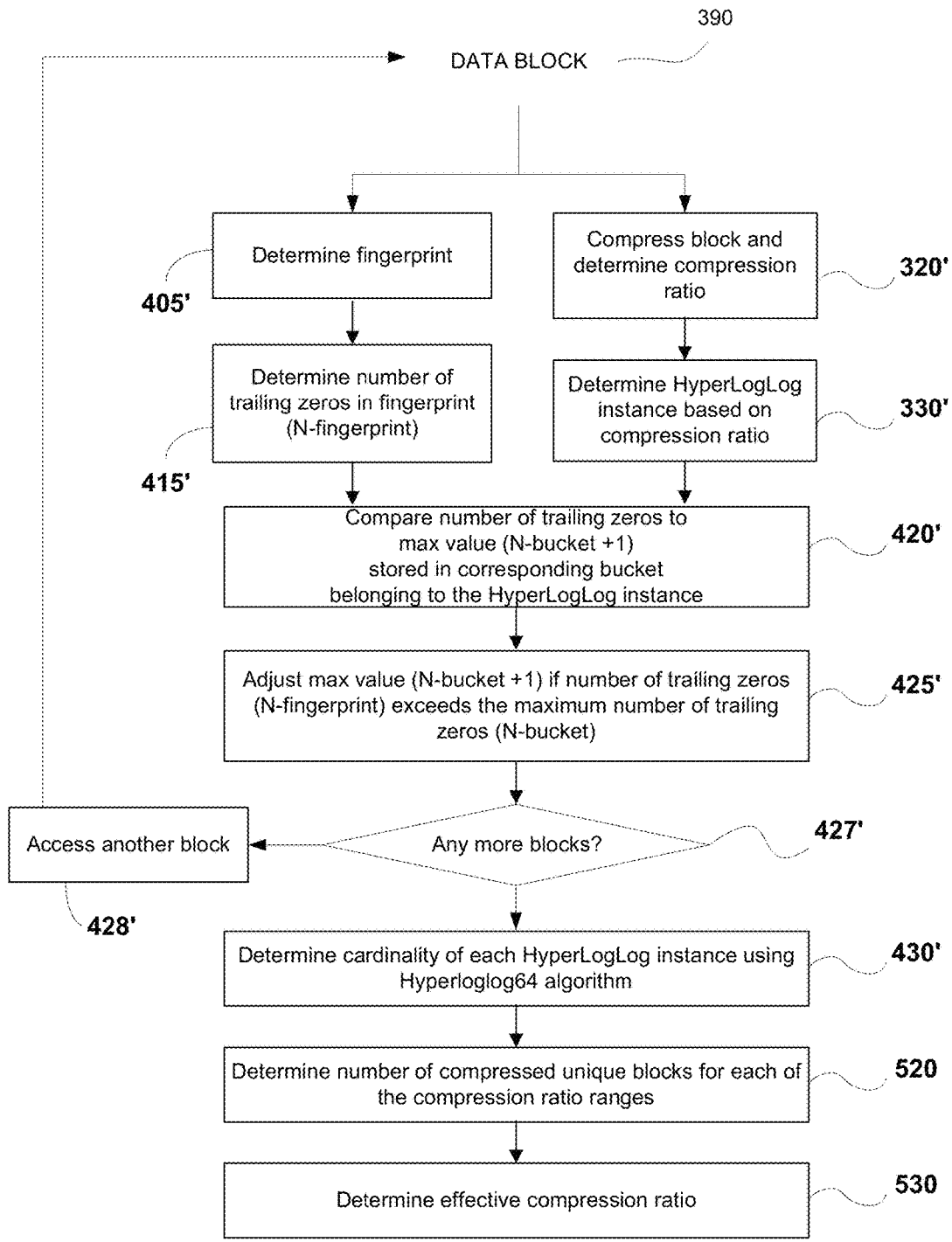
FIG. 5A is a flow diagram illustrating a method for determining cost savings on a storage array including the estimation of an effective compression ratio, in accordance with one embodiment of the present disclosure.

In addition, for block 390, operations are performed as outlined by flow diagram 500A, which is more fully described in relation to FIG. 5A. In particular, flow diagram 500A is performed to determine compression cost savings. In that manner, the effective cost savings from compression performed at storage array 102 is estimated as an overall or effective compression ratio 355. In general, for flow diagram 500A outlining the compression process, the method determines the average compression ratio across the blocks. For example, compression is performed on each block 390 in operation 320, using a compression algorithm (e.g., the lossless LZ4 data compression algorithm), and a compression ratio can be determined. A corresponding block that is compressed is arranged into buckets (e.g., 340A-N) based on the corresponding compression ratio. As shown, in one implementation, bucket 340A includes blocks that are uncompressed having a compression ratio of 1.0, bucket 340B includes blocks that have compression ratios ranging between greater than 1.0 up to and including 2.0, bucket 340C includes blocks that have compression ratios ranging between greater than 2.0 up to and including 3.0, . . . , and bucket 340N includes blocks that have compression ratios ranging between greater than 20.0 up to and including 21.0. Of course, in other embodiments, other ranges for compression ratios can be defined for the buckets 340A-N, and other values for the upper range of compression ratios may be accommodated. For each of the buckets 340A-N, a hyperloglog algorithm is applied to determine the cardinality of each of the buckets, wherein the cardinality defines the estimated number of unique elements in the corresponding bucket. For each bucket 340A-N, a corresponding bucket compression ratio can be determined. The average compression ratio for a corresponding block is then applied to the estimated unique number of blocks (e.g., cardinality determined using the hyperloglog process) (for example, this follows the process outlined introduced in flow diagram 400A, but uses a differently defined dataset) to determine the number of compressed blocks for the corresponding block. An overall effective compression ratio 355 may be determined for the set of buckets based on the number of compressed blocks determined from each of the buckets 340A-N.

Figure 4B:
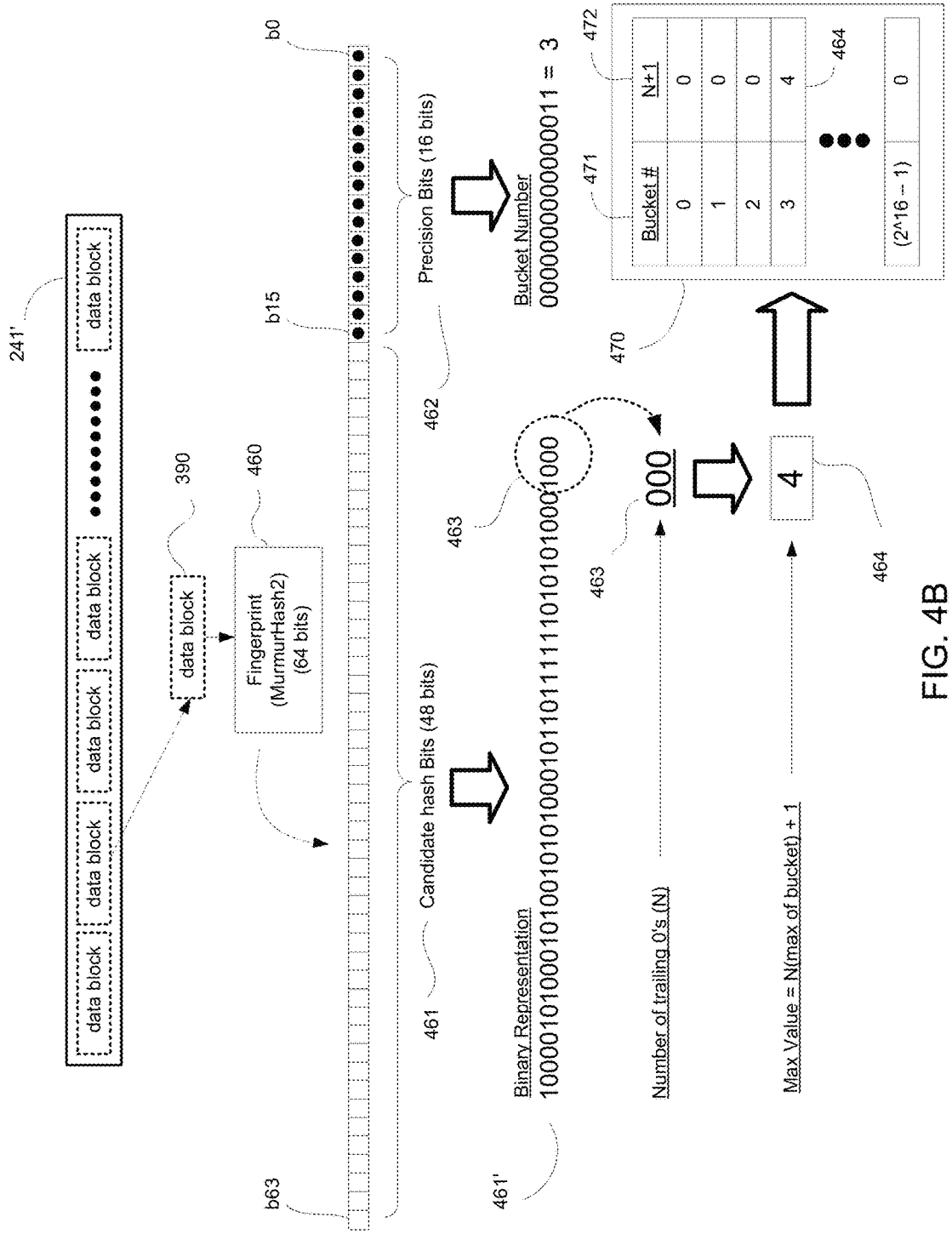
FIG. 4B illustrates the implementation of the method of FIG. 4A on a data block, in accordance with one embodiment of the present disclosure.

FIGS. 4A and 4B combined illustrate the process performed for estimating the cost savings on a storage array 102 due to deduplication processes performed at the array 102, in embodiments. In particular, FIG. 4A is a flow diagram 400A (first introduced in FIGS. 2 and 3) illustrating a method for determining cost savings on a storage array including the estimation of a deduplication ratio, in accordance with one embodiment of the present disclosure. As previously described, flow diagram 400A is performed by deduplication savings estimator 170 of a host 116, 118 of FIG. 1. FIG. 4B illustrates the implementation of the method of FIG. 4A on a data block 390, in accordance with one embodiment of the present disclosure.

Generally, the process outlined in flow diagram 400A is performed to determine an effective deduplication ratio for a unit of storage in storage array 102. In particular, flow diagram 400A is performed on each block 390 in queue 241' that is generated from the data received from a storage array 102, as described in FIG. 2, wherein the data is accessed over a communication network from a unit of storage (e.g., volume, LUN, area, etc. of storage array 102). The data is parsed and/or arranged into a plurality of blocks, wherein the blocks are uncompressed. A plurality of fingerprints is generated based on the plurality of blocks using a hash algorithm (e.g., MurmurHash2 algorithm). A deduplication ratio is estimated for the plurality of blocks using a hyperloglog process (e.g., using a Hyperloglog64 algorithm using a fingerprint of 64 bits), wherein the hyperloglog process is performed on a first plurality of buckets compartmentalizing the plurality of blocks, and wherein the plurality of buckets is defined by precision bits of the plurality of fingerprints.

In particular, in operation 405 of flow diagram 400A, a fingerprint 460 is determined for the corresponding block 390. The fingerprint 460 is produced from a high-performance hash function that is used to uniquely identify corresponding blocks of data. For example, in one implementation the hash function may be a MurmurHash2 (64 bit configuration) algorithm that is applied on each selected block 390 to create a corresponding hash/hash key/fingerprint 460. As shown in FIG. 4B, each fingerprint 460 includes candidate hash bits (e.g., hash value) 461 and precision bits 462.

For a 64 bit fingerprint 460, the precision bits 462 include 16 bits, having bit numbers b0 to b15, with bit numbering beginning with bit b0. An exemplary binary representation 462' of the precision bits 462 is provided in FIG. 4B. At operation 410 of FIG. 4A, a corresponding bucket index number is determined based on the precision bits 462, wherein the index number defines a corresponding bucket for the corresponding block and its fingerprint 460. The bucket is used to store a value that can be further used to determine cardinality for the set of blocks associated with the corresponding bucket, as will be further described below.

Further compartmentalization of the fingerprints 460 into buckets is performed to increase the accuracy when determining the effective deduplication ratio 350. More particularly, bucketization is performed to increase the accuracy when determining the cardinality of unique blocks from the queue 241' of blocks (e.g., determined through a hyperloglog process), wherein the effect of cardinality is emulated across multiple experiments. As such, the set of hash values (e.g., fingerprints 460) is divided further into 'm' subsets (called buckets), such that each hash value 460 can be placed into one of the subsets (e.g., buckets), based on its value (e.g., the value of the corresponding precision bits 462). For example, in the Hyperloglog64 algorithm using a 64 bit fingerprint 460 (e.g., determined through the Murmurhash2 algorithm), there are 16 precision bits used for determining bucket indices. For example, as shown in FIG. 4B, the binary representation of precision bits 462' has a value of "3," which is the bucket index number for the corresponding fingerprint 460. Further operations in flow diagram 400A are performed with respect to the corresponding bucket index number (e.g., bucket number 3) for the corresponding fingerprint 460.

More particularly, at operation 415, the number of trailing zeros (e.g., $N_{fingerprint}$) is determined from the hash value (or candidate hash bits) 461. For a 64 bit fingerprint 460, the candidate hash bits include 48 total bits, having bit numbers b16 to b63, with bit numbering beginning with bit b0. An exemplary binary representation 461' of the hash value 461 is provided in FIG. 4B.

At operation 420, the number of trailing zeros determined from the hash value (e.g., binary representation 461') is compared to the maximum number of trailing zeros observed ($N_{bucket}$) from the subset of blocks having fingerprints with the same bucket index number (e.g., based on similar precision bits). In particular, the corresponding bucket stores a maximum value (e.g., "$N_{bucket}+1$") that is based on the maximum number of trailing zeros observed ($N_{bucket}$) for fingerprints associated with the corresponding bucket. As such, in operation 420, the number of trailing zeros ($N_{fingerprint}$) determined from the hash value 461' is compared against the maximum number ($N_{bucket}+1$) stored in the corresponding bucket (wherein the maximum number of trailing zeros observed ($N_{bucket}$) for fingerprints associated with the corresponding bucket can be inferred from the maximum value ($N_{bucket}+1$) stored. For example, in one implementation the maximum value ($N_{bucket}+1$) of the corresponding bucket comprises the maximum trailing zeros observed ($N_{bucket}$) for hash keys associated with the corresponding bucket plus one.

At operation 425, the maximum value ($N_{bucket}+1$) is modified/adjusted when the number of trailing zeros ($N_{fingerprint}$) in the hash value 461' is greater than the maximum number of trailing zeros observed ($N_{bucket}$), based on the maximum value ($N_{bucket}+1$) stored. In addition, at operations 427 and 428, the previously described operations outlined in 405, 410, 415, 420, and 425 are repeated for all data blocks (e.g., data blocks in queue 241').

At operation 430, a cardinality of the corresponding bucket is determined based on the maximum value ($N_{bucket}+1$) stored. Cardinality is a probabilistic way of determining the number of unique elements in a large set (e.g., number of blocks in a storage array 102, blocks in a bucket, etc.). In particular, when estimating deduplication cost savings, a hyperloglog process (e.g., Hyperloglog64 algorithm) and data structure (e.g., fingerprints compartmentalized into buckets based on precision bits) is used for determining cardinality, which estimates the number of unique items instead of duplicates of a large data set (blocks in the corresponding bucket) having a fixed size of memory. Hyperloglog is introduced in "LogLog Counting of Large Cardinalities," G. Di Battista and U. Zwick (Eds.): ESA 2003, LNCS 2832, pp. 605-617, 2003, by Marianne Durand and Philippe Flajolet, which is introduced herein by reference. For example, the probability of a single bit being '1' is 50 percent. Following that line of reasoning, in a well distributed, random set of numbers/integers: 50% of numbers in the set will end with '1' (e.g., xxxx ... xxx1); 25% of numbers will end with '10' (e.g., xxxx ... xx10); 12.5% of number will end with '100' (e.g., xxx ... x100) (hashing 8 unique numbers using a hash algorithm with a good distribution, one of the hashes will end with 'xxx100). By inverting the expectation on cardinality, by looking at the maximum number of trailing zeros in a set, the cardinality of the set can be inferred. For example, if the highest number of trailing zeros in a binary representation observed is of value '2' (e.g., xxx ... xx100), then there are probably 8 unique elements in the set. In one embodiment, the estimation of cardinality is defined by equation 1, as follows:

$$E := \frac{\alpha_m m^2}{\sum_{j=1}^{m} 2^{-M(j)}}, \quad (1)$$

where j is taken from 0 to $2^{16}$, and m=$2^{16}$, and α=0.7213/(1+[1.079/m]).

Further, the cardinality of the plurality of buckets associated with the data stored in the unit of storage may be estimated, once all the blocks in the queue 241' have been processed. In particular, a plurality of cardinalities of the plurality of buckets (based on precision bits) is determined based on the plurality of maximum values (e.g., $N_{bucket}$+1) stored in the buckets using the hyperloglog algorithm, previously described (e.g., see Eqn. 1). In operation 435, a harmonic mean of the plurality of cardinalities associated with the buckets is determined, wherein the harmonic mean defines a uniform cardinality for each bucket. A supercardinality is determined for the plurality of blocks stored in the unit of storage by multiplying the number of buckets in the plurality of buckets by the harmonic mean. Thereafter, the effective deduplication ratio for the plurality of blocks stored in the unit of storage is estimated by dividing the total number of blocks in the plurality of blocks by the supercardinality.

As an advantage, metadata in the form of fingerprints 460 or hash keys are not stored in memory. For example, the buffer containing IOs (e.g., blocks, fingerprints, hash values, precision bits, number of trailing zeros, etc.) is flushed after processing. The data that is stored is of fixed size, and includes the maximum value ($N_{bucket}$+1) of each of the buckets. In one implementation, to store 48 trailing zeros (e.g., for a 48 bit hash/fingerprint), 6 bits are required for a corresponding bucket, wherein the 6 bits may be conservatively estimated as 1 byte (B). The total number of buckets is 2^16 bits ($2^{16}$) (the number of precision bits designating a bucket index). As such, the total memory required for trailing zeros in all the buckets is a fixed size of 48-64 kilobytes (KB) (bits for storing the number of trailing zeros, such as 48, by the number of buckets) (wherein at the high end, 6 bits are estimated to 1 byte). This memory size is fixed, and has a small memory footprint, and has an advantage of being able to handle estimations of deduplication savings for all sizes of possible volumes (e.g., over 200 terabytes). In addition, this memory size can handle any increase in scaling of the size of the storage array 102, and/or increases in different block sizes. In still another embodiment, the precision bits number may number 14, with a total memory size of 16 KB.

A zero-block contains only zeros. In one embodiment, zero-blocks are not considered in the total number blocks when determining deduplication and compression savings. In another embodiment, the number of zero-blocks is reported. In still another embodiment, zero-block pruning is enabled, which reports the number of zero-blocks, and considers them as data savings.

FIG. 5A is a flow diagram 500A (first introduced in FIGS. 2 and 3) illustrating a method for determining cost savings on a storage array including the estimation of an effective compression ratio, in accordance with one embodiment of the present disclosure. As previously described, flow diagram 500A is performed by compression savings estimator 180 of a host 116, 118 of FIG. 1. Generally, the process outlined in flow diagram 500A is performed to determine an effective compression ratio for a unit of storage in storage array 102. In particular, flow diagram 500A is performed on each block 390 in queue 241' that is generated from the data received from a storage array 102, as described in FIG. 2, wherein the data is accessed over a communication network from a unit of storage (e.g., volume, LUN, area, etc. of storage array 102). The data is parsed and/or arranged into a plurality of blocks, wherein the blocks are uncompressed. A plurality of fingerprints is generated based on the plurality of blocks using a hash algorithm (e.g., MurmurHash2 algorithm). The fingerprint may be determined using flow diagram 400A, or may be separately determined using the same or different hash algorithm. An effective compression ratio is estimated for the plurality of blocks using a hyperloglog process (e.g., using a Hyperloglog64 algorithm using a fingerprint of 64 bits), wherein the hyperloglog process is performed a second plurality of buckets compartmentalizing the plurality of blocks, and wherein the plurality of buckets is defined by ranges of compression ratios.

Portions of flow diagram 500A disclose a method for determining compression ratios for the second plurality of buckets. For example, the average compression ratio may be determined across all the blocks. At operation 320', the corresponding data block 390 is compressed, using a compression algorithm (e.g., the lossless LZ4 data compression algorithm). In addition, at operation 330', a compression ratio for the block 390 can be determined. For example, a compression ratio is determined by dividing the uncompressed size of block 390 by the compressed size of block 390. The compression ratio is a value equal to or greater than '1'.

At operation 330', a bucket index is determined based on the compression ratio, as previously described in FIG. 3. That is, the HyperLogLog instance is determined based on the compression ratio, in one implementation. For example, the corresponding data block 390 may be assigned to one of buckets 340A-N of FIG. 3, based on the corresponding compression ratio, wherein in one example implementation, the compression ratio ranges for the buckets is defined as follows: bucket 340A has a range of compression ratios of 1.0 (e.g., uncompressed); bucket 340B has a range between greater than 1.0 up to and including 2.0; bucket 340C has a range between greater than 2.0 up to and including 3.0, . . . , and bucket 340N has a range between greater than 20.0 up to and including 21.0.

In parallel, a hyperloglog algorithm is applied to determine the cardinality of each of the buckets (e.g., buckets 340A-N), wherein the cardinality defines the estimated number of unique elements in the corresponding bucket, wherein the bucket is defined by a range of compression ratios. The cardinality is determined using a hyperloglog process, as previously described. In particular, at operation 405', a fingerprint is determined for the corresponding block 390. The fingerprint may be same fingerprint 460 generated from flow diagram 400A, or may be a different fingerprint generated using the same (e.g., MurmurHash2, 64 bit hash algorithm) function or different hash function, wherein the fingerprints uniquely identify corresponding blocks of data. For ease of illustration, the same fingerprint 460 is generated and used in both flow diagrams 400A and 500A. As previously described, each 64 bit fingerprint includes candidate hash bits (e.g., hash value 461) of 48 bits, and remaining precision bits 462 (which are not used in the compression process).

In particular, for each bucket 340A-N, a number of compressed blocks can be determined based on the average compression ratio for the corresponding bucket and the cardinality of the bucket. Cardinality is determined using the hyperloglog process on the set of buckets, wherein each bucket in the set of buckets is now defined differently in flow diagram 500A (based on compression ratio) than in flow diagram 400A (based on precision bits). More particularly, at operation 415', the number of trailing zeros (e.g., $N_{fingerprint}$) is determined from the hash value 461. An exemplary binary representation 461' of the hash value 461 is provided in FIG. 4B. Further compartmentalization of the fingerprints 460 into buckets, based on compression ratio described above, is performed to increase the accuracy when determining the effective compression ratio 355 of the plurality of blocks because bucketization gives greater accuracy when determining the cardinality of unique blocks from the queue 241" of blocks. As such, the set of hash values (e.g., fingerprints 460) is divided further into 'm' subsets (called buckets), such that each hash value 460 can be placed into one of the subsets (e.g., buckets), based on its value (e.g., the value of the corresponding compression ratio).

At operation 420', the number of trailing zeros determined from the hash value (e.g., binary representation 461') is compared to the maximum number of trailing zeros observed ($N_{bucket}$) from the subset of blocks having fingerprints with the same bucket index number (e.g., based on similar precision bits). In particular, the corresponding bucket (e.g., belonging to a HyperLogLog instance) stores a maximum value (e.g., "$N_{bucket}+1$") that is based on the maximum number of trailing zeros observed ($N_{bucket}$) for fingerprints associated with the corresponding bucket. As such, in operation 420', the number of trailing zeros ($N_{fingerprint}$) determined from the hash value 461' is compared against the maximum number ($N_{bucket}+1$) stored in the corresponding bucket (wherein the maximum number of trailing zeros observed ($N_{bucket}$) for fingerprints associated with the corresponding bucket can be inferred from the maximum value ($N_{bucket}+1$) stored. For example, in one implementation the maximum value ($N_{bucket}+1$) of the corresponding bucket comprises the maximum trailing zeros observed ($N_{bucket}$) for hash keys associated with the corresponding bucket plus one, and wherein the cardinality of the corresponding bucket is based on the maximum value ($N_{bucket}+1$).

In addition, at operation 425', the maximum value ($N_{bucket}+1$) is modified/adjusted when the number of trailing zeros ($N_{fingerprint}$) in the hash value 461' is greater than the maximum number of trailing zeros observed ($N_{bucket}$), based on the maximum value ($N_{bucket}+1$) stored. In addition, at operations 427' and 428', the previously described operations outlined in 320', 330', 405', 415', 420', and 425' are repeated for all data blocks (e.g., data blocks in queue 241').

At operation 430', a cardinality of the corresponding bucket is determined based on the maximum value ($N_{bucket}+1$) stored. For example, the cardinality of each HyperLogLog instance is determined using the HyperLogLog64 algorithm. As previously described, cardinality is a probabilistic way of determining the number of unique elements in a large set (e.g., number of blocks in a storage array 102, blocks in a bucket, etc.). In particular, when estimating compression cost savings, a hyperloglog process (e.g., Hyperloglog64 algorithm) and data structure (e.g., fingerprint compartmentalized into buckets based on compression ratios) is used for determining cardinality, which estimates the number of unique items (e.g., unique number of blocks in a bucket). By inverting the expectation on cardinality, by looking at the maximum number of trailing zeros in a set, the cardinality of the set can be inferred. For example, the estimation of cardinality for a corresponding bucket is defined by equation 1, previously introduced.

At operation 520, the number of compressed blocks in the corresponding bucket is determined. For example, the number of compressed unique blocks is determined for each of the compression ratio ranges. In one implementation, a selected compression ratio for a corresponding block is then applied to the estimated unique number of blocks (e.g., cardinality) to determine the number of compressed blocks for the corresponding bucket. Cardinality is determined using the hyperloglog process (for example, this follows the process outlined introduced in flow diagram 400A, but uses a differently defined dataset). In particular, for a corresponding bucket, the total number of uncompressed blocks is referred to as the "total block count." The number of compressed blocks per bucket is determined by dividing the "total block count" by the "compression ratio" associated with that bucket. The selected compression ratio may be defined using a variety of methods. For example, the compression ratio for a corresponding bucket is the average of compression ratios for blocks associated with the bucket, in one embodiment. In other embodiments, the compression ratio may be a predetermined number falling within the range of compression ratios defined for that bucket (e.g., middle of range, beginning of range, end of range, at some intermediate value within the range, etc.).

At operation 530, an overall effective compression ratio 355 may be determined for the set of buckets (considering all the blocks according to a sampling ratio) based on the number of compressed blocks determined from each of the buckets. In particular, a plurality of cardinalities of the plurality of buckets (e.g., generated from compression ratios) is generated based on a plurality of maximum values stored in the buckets using the hyperloglog algorithm. For each bucket, a corresponding number of compressed blocks is determined by dividing the corresponding cardinality by an associated compression ratio, as described above. For the data set (e.g., set of buckets), the "total number of compressed blocks" is the sum of all per-bucket compressed block counts. Also, the effective compression ratio for the dataset is the "total block count" divided by the "total number of compressed blocks."

Figure 5B:
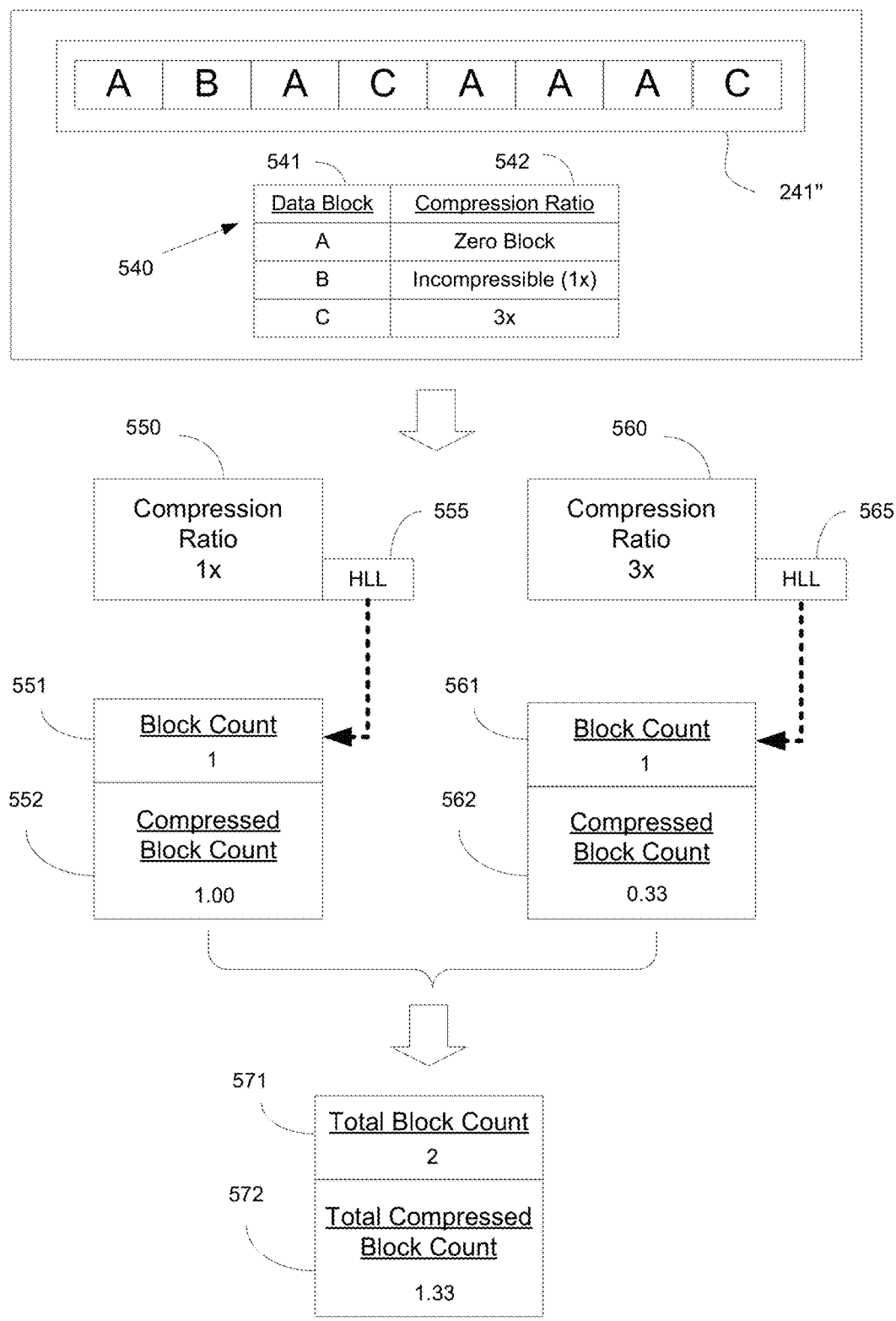
FIG. 5B illustrates the implementation of the method of FIG. 5A on a plurality of data blocks, in accordance with one embodiment of the present disclosure.

FIG. 5B illustrates the implementation of the method of FIG. 5A on a queue 241" of data blocks, in accordance with one embodiment of the present disclosure. That is, FIGS. 5A and 5B combined illustrate the process performed for estimating the cost savings on a storage array 102 due to compression processes performed at the array 102, in embodiments.

As shown, a queue 241" of blocks includes block A, block B, and block C for illustration purposes. For illustration, each of the blocks so categorized are unique. Table 540 discloses the compression ratios for the blocks. For example, block B is incompressible, and as such has a compression ratio of '1×'. Block C has a compression ratio of '3×'. Block A may be a zero-block, wherein a zero-block contains only zeros. As shown in FIG. 5B, zero-blocks A are not considered in the total block count when determining compression savings. In other embodiments, the number of zero-blocks is considered when determining compression savings.

In operation 560, the blocks that are uncompressed are bucketized (e.g., into a bucket associated with a compression ratio of 1×), and a hyperloglog (HLL) process is performed in operation 555. For the corresponding bucket, the cardinality or block count 551 for the bucket is of value '1', since there is one block "B" shown in queue 241". In addition, a compressed block count previously described may be determined, and is of value '1.00'.

In operation 561, the blocks C having a compression ratio of '3' are bucketized (e.g., into a bucket associated with a compression ratio range (e.g., between greater than 2.0 up to and including 3.0), and a hyperloglog process is performed in operation 565. For the corresponding bucket or hyperloglog instance, the cardinality or block count 561 is of value '1', since there is one unique block, which is "C", having a compression ratio of 3× shown in queue 241". In addition, a compressed block count 562 previously described may be determined, and is of value '0.33'.

An overall effective compression ratio 355 may be determined for the set of buckets (considering all the blocks in queue 241" according to a sampling ratio) based on the number of compressed blocks determined from each of the buckets, as previously described. For the data set (e.g., set of buckets), the "total block count" is of value '2', and the "total number of compressed blocks" is the sum of all per-bucket compressed block counts, which is of value '1.33'. Also, the effective compression ratio for the dataset is the "total block count" divided by the "total number of compressed blocks."

Figure 6:
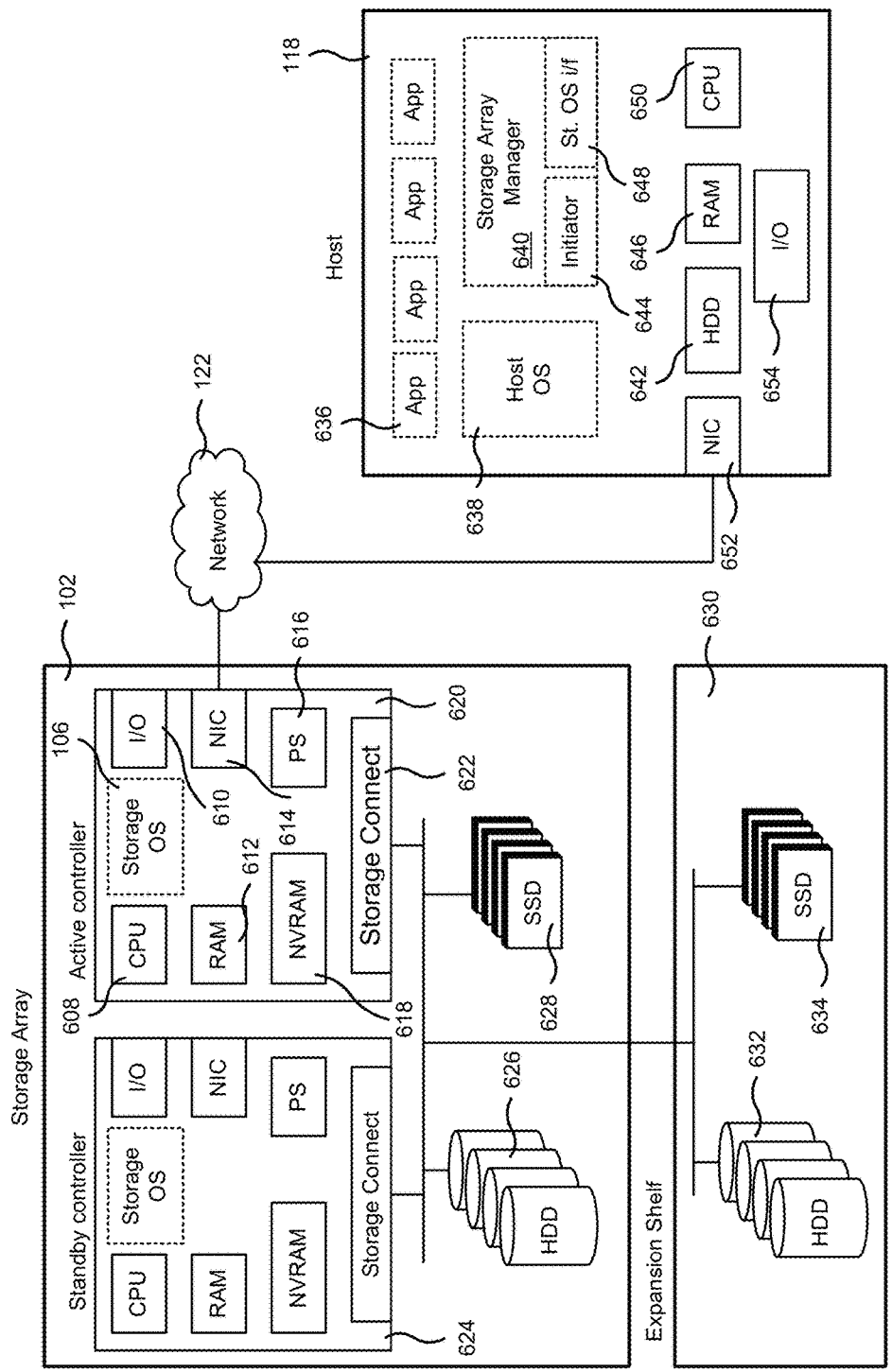
FIG. 6 illustrates the architecture of a storage array including a host computer used for accessing the storage array, in accordance with one embodiment of the present disclosure.

FIG. 6 illustrates an example architecture of a storage array 102, according to one embodiment. In one embodiment, storage array 102 includes an active controller 620, a standby controller 624, one or more HDDs 626, and one or more SSDs 628. It is important to note that either controller can operate in the active mode, and either controller can operate in the standby mode, such that when both controllers are on-line one controller is designated as the active controller and functions to service IOs from one or more hosts, while the other controller remains in standby mode ready to step in and handle the IOs when a failure (real or instantiated) to the active controller occurs. As such, the active controller 620 and the standby controller 624 are configured similarly and mirrored appropriately, such that either controller when designated active can access (e.g., write, read, etc.) data stored in any of the storage mediums of the storage array 102, including a corresponding NVRAM, read cache SSD 628, and HDD 626 to serve IOs from hosts. In one embodiment, the active controller 620 includes NVRAM 618, which in one implementation is used for immediately storing the incoming data (e.g., write data) as it arrives to the storage array. In that manner, storage array 102 provides immediate acknowledgment of a write request to the requesting host. After the data is processed (e.g., compressed and organized in segments (e.g., coalesced)), the data is transferred from the NVRAM 618 to HDD 626, or to read cache SSD 628 if the data is determined to be cache worthy, or to both.

The active controller 620 includes various components that enable efficient processing of read and write requests. For instance, data from a write operation is stored first in the NVRAM 618 of active controller 620, and provides for immediate acknowledgment of acceptance and storage of the data back to the host, thereby providing increased storage system performance. Because the data is later stored in HDD 626 and/or SSD 628, a later read access will retrieve the data from the location giving the quickest access. For example, the data is retrieved from NVRAM 618 for the quickest response time if the data is still available. Further description of the operations performed during write and read requests is provided in relation to FIGS. 3 and 4.

In addition, the active controller 620 further includes CPU 608, general-purpose RAM 612 (e.g., used by the programs executing in CPU 608), input/output module 610 for communicating with external devices (e.g., USB port, terminal port, connectors, plugs, links, etc.), one or more network interface cards (NICs) 614 for exchanging data packages through network 656, one or more power supplies 616, a temperature sensor (not shown), and a storage connect module 622 for sending and receiving data to and from the HDD 626 and SSD 628. In one embodiment, active controller 620 is configured to perform cross-charging of costs when scheduling IOs accessing a portion of a data storage system (e.g., LUN, volume, etc.) in a scheduler hierarchy as implemented across a plurality of cores of a CPU. In one embodiment, standby controller 624 includes the same components as active controller 620.

In one embodiment, bus 290 provides connectivity between the components of the active controller 620 and the components of the standby controller 624, for example to implement an active/standby array configuration, wherein the active controller 620 services IO requests from one or more hosts and the standby controller 624 services write cache mirroring requests (e.g., mirrors writes to NVRAM 618 to NVRAM 299) while remaining ready to assume the primary responsibility of servicing IOs when a failure occurs at the active controller 620.

Active controller 620 is configured to execute one or more computer programs stored in RAM 612. One of the computer programs is the storage operating system (OS) used to perform operating system functions for the active controller device. In some implementations, one or more expansion shelves 630 may be coupled to storage array 102 to increase HDD 632 capacity, or SSD 634 capacity, or both.

In one embodiment, active controller 620 and standby controller 624 have their own NVRAMs, but they share HDDs 626 and SSDs 628. The standby controller 624 receives copies of what gets stored in the NVRAM 618 of the active controller 620 and stores the copies in its own NVRAM 299. If the active controller 620 fails, standby controller 624 takes over the management of the storage array 102. For example, one or both of the failover managers 134 in the controllers 620 and 624 implement and/or manage the failover process. When servers, also referred to herein as hosts, connect to the storage array 102, read/write requests (e.g., IO requests) are sent over network 656, and the storage array 102 stores the sent data or sends back the requested data to host 118.

Host 118 is a computing device including a CPU 650, memory (RAM) 646, permanent storage (HDD) 642, a NIC card 652, and an IO module 654. The host 118 includes one or more applications 636 executing on CPU 650, a host operating system 638, and a computer program storage array manager 640 that provides an interface for accessing storage array 102 to applications 636. Storage array manager 640 includes an initiator 644 and a storage OS interface program 648. When an IO operation is requested by one of the applications 636, the initiator 644 establishes a connection with storage array 102 in one of the supported formats (e.g., iSCSI, Fibre Channel, or any other protocol). The storage OS interface 648 provides console capabilities for managing the storage array 102 by communicating with the active controller 620 and the storage OS 106 executing therein.

To process IO requests, resources from the storage array 102 are required. Some of these resources may be a bottleneck in the processing of storage requests because the resources are over utilized, or are slow, or for any other reason. In general, the CPU and the hard drives of the storage array 102 can become over-utilized and become performance bottlenecks. For example, the CPU may become very busy because the CPU is utilized for processing storage IO requests while also performing background tasks, such as garbage collection, snapshots, replication, alert reporting, etc. In one example, if there are many cache hits (i.e., the SSD contains the requested data during IO requests, the SSD cache, which is a fast responding system may press the CPU for cycles, thus causing potential bottlenecks for other requested IOs or for processing background operations. The hard disks may also become a bottleneck because the inherent access speed to data is slow when compared to accessing data from emery (e.g., NVRAM) or SSD 628. Embodiments of the present invention are able to reduce bottlenecks at the CPU and/or HDD, by ensuring that the CPU or disk access resources assigned to various tasks controlled by cross-charging of costs when scheduling IOs accessing a portion of a data storage system (e.g., LUN, volume, etc.) in a scheduler hierarchy as implemented across a plurality of cores, and when applying rate limits based on the cross-charged costs. This provides for efficient use of resources, thereby reducing the overall cost and use of those resources when met with a given demand.

Accordingly, embodiments of the present disclosure disclosing the estimation of cost savings in a data storage system, including estimating the data deduplication and effective compression ratios of data stored in the data storage system, have been described. While specific embodiments have been provided to demonstrate the fair allocation of resources of a flow based on cross-charging of costs, these are described by way of example and not by way of limitation. Those skilled in the art having read the present disclosure will realize additional embodiments falling within the spirit and scope of the present disclosure.

With the above embodiments in mind, it should be understood that the disclosure can employ various computer-implemented operations involving data stored in computer systems. These operations are those requiring physical manipulation of physical quantities. Any of the operations described herein that form part of the disclosure are useful machine operations. The disclosure also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

One or more embodiments can also be fabricated as computer readable code on a non-transitory computer readable storage medium. The non-transitory computer readable storage medium is any non-transitory data storage device that can store data, which can be thereafter be read by a computer system. Examples of the non-transitory computer readable storage medium include hard drives, network attached storage (NAS), read-only memory, random-access memory, CD-ROMs, CD-Rs, CD-RWs, magnetic tapes and other optical and non-optical data storage devices. The non-transitory computer readable storage medium can include computer readable storage medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for estimation, comprising:
accessing, over a communication network, data from a unit of storage of a data storage system;
parsing a plurality of blocks from the data, wherein each of the plurality of blocks of data is uncompressed;
determining a compression ratio for each of the blocks;
for each of the blocks, assigning the block to one of a plurality of buckets based on the determined compression ratio for the block, wherein the plurality of buckets are associated with respective ranges of compression ratios;
estimating a cardinality of each of the plurality of buckets using a hyperloglog technique; and
estimating a post-deduplication compression ratio for the plurality of blocks stored in the unit of storage based on the respective ranges of compression ratios associated with each of the buckets and the estimated cardinality of each of the buckets.

2. The method of claim 1, comprising:
compressing each block of the plurality of blocks, wherein, for each of the blocks, the compression ratio for the block is determined based on a compressed size of the block.

3. The method of claim 2, wherein each cardinality represents an estimated number of unique blocks for a respective one of the buckets.

4. The method of claim 1, wherein estimating the post-deduplication compression ratio comprises:
for each of the buckets, determining a number of compressed blocks for the bucket by dividing the estimated cardinality of the bucket by the compression ratio associated with the bucket.

5. The method of claim 4, wherein estimating the post-deduplication compression ratio comprises:

determining a total number of compressed blocks by adding the number of compressed blocks of each bucket.

6. The method of claim 5, wherein estimating the post-deduplication compression ratio comprises:
determining the estimated post-deduplication compression ratio for the plurality of blocks by dividing a total number of blocks in the plurality of blocks by the total number of compressed blocks.

7. The method of claim 1, wherein the unit of storage comprises a volume or LUN.

8. A method for estimation, comprising:
accessing, over a communication network, data from a unit of storage of a data storage system;
parsing a plurality of blocks from the data, wherein each of the plurality of blocks of data is uncompressed;
determining a compression ratio for each of the blocks;
for each of the blocks, assigning the block to one of a plurality of buckets based on the determined compression ratio for the block, wherein the plurality of buckets are associated with respective ranges of compression ratios;
generating a plurality of fingerprints based on the plurality of blocks using a hash algorithm;
estimating a cardinality of each of the plurality of buckets, each cardinality representing an estimated number of unique blocks for a respective one of the buckets; and
estimating a post-deduplication compression ratio for the plurality of blocks stored in the unit of storage based on the respective ranges of compression ratios associated with each of the buckets and the estimated cardinality of each of the buckets.

9. The method of claim 8, comprising:
compressing each block of the plurality of blocks, wherein, for each of the blocks, the compression ratio for the block is determined based on a compressed size of the block.

10. The method of claim 8, wherein estimating the post-deduplication compression ratio comprises:
for each of the buckets, determining a number of compressed blocks for the bucket by dividing the cardinality of the bucket by the compression ratio associated with the bucket;
determining a total number of compressed blocks by adding the number of compressed blocks of each bucket; and
determining the estimated post-deduplication compression ratio for the plurality of blocks by dividing a total number of blocks in the plurality of blocks by the total number of compressed blocks.

11. The method of claim 8, wherein, for each of the buckets, the cardinality the bucket is estimated using a hyperloglog technique.

12. A non-transitory computer-readable medium comprising program instructions to:
access, over a communication network, data from a unit of storage of a data storage system;
parse a plurality of blocks from the data, wherein each of the plurality of blocks of data is uncompressed;
determine a compression ratio for each of the blocks;
for each of the blocks, assign the block to one of a plurality of buckets based on the determined compression ratio for the block, wherein the plurality of buckets are associated with respective ranges of compression ratios;
estimate a cardinality of each of the plurality of buckets, each cardinality representing an estimated number of unique blocks for a respective one of the buckets; and
estimate a post-deduplication compression ratio for the plurality of blocks stored in the unit of storage based on the respective ranges of compression ratios associated with each of the buckets and the estimated cardinality of each of the buckets.

13. The non-transitory computer-readable medium of claim 12, comprising program instructions to:
for each of the buckets, determine a number of compressed blocks for the bucket by dividing the estimated cardinality of the bucket by the compression ratio associated with the bucket
determine a total number of compressed blocks by adding the number of compressed blocks of each bucket; and
determine the estimated post-deduplication compression ratio for the plurality of blocks by dividing a total number of blocks in the plurality of blocks by the total number of compressed blocks.

14. The non-transitory computer-readable medium of claim 12, comprising program instructions to use a hyperloglog technique estimated the cardinality of each of the buckets.

15. The non-transitory computer-readable medium of claim 12, comprising program instructions to compress each block of the plurality of blocks, wherein, for each of the blocks, the compression ratio for the block is determined based on a compressed size of the block.

16. The non-transitory computer-readable medium of claim 13, comprising program instructions to:
determine a total number of compressed blocks by adding the number of compressed blocks of each bucket.

17. The non-transitory computer-readable medium of claim 16, comprising program instructions to:
determine the estimated post-deduplication compression ratio for the plurality of blocks by dividing a total number of blocks in the plurality of blocks by the total number of compressed blocks.

* * * * *